Aug. 5, 1969 E. J. WITTMANN 3,460,049

SINGLE ENDED AND DIFFERENTIAL STABILIZED AMPLIFIER

Filed Dec. 15, 1967

Inventor:
ERWIN J. WITTMANN

By Eugene M. Whitacre
Attorney

United States Patent Office 3,460,049
Patented Aug. 5, 1969

3,460,049

SINGLE ENDED AND DIFFERENTIAL STABILIZED AMPLIFIER

Erwin J. Wittmann, North Plainfield, N.J., assignor to RCA Corporation, a corporation of Delaware Filed Dec. 15, 1967, Ser. No. 690,832
Int. Cl. H03f *1/08*
U.S. Cl. 330—28 7 Claims

ABSTRACT OF THE DISCLOSURE

A single ended and differential stabilized amplifier which is completely biased by only one power supply. Although capacitors to bypass emitter bias resistors are not utilized, low impedance points prevent a substantial sacrifice in gain.

This invention relates to stabilized amplifiers, and more particularly, to both the single ended stabilized amplifier and the differential stabilized amplifier.

The invention as described herein may be embodied in either discrete circuit form or integrated circuit form, depending on the needs and desires of the user. The term integrated circuit, as used herein, refers to a unitary or monolithic semiconductor device or chip which is the equivalent of a network of interconnected active and passive circuit elements.

Various problems have presented themselves in the design of integrated circuits. One significant problem is that of providing capacitance on an integrated circuit chip. Since large areas of the chip must be utilized to provide only relatively small values of capacitance, it is desirable to omit capacitors whenever possible. This omission frequently involves a substantial sacrifice in the gain of an amplifier unit, as bypass capacitors can not be used to shunt emitter bias resistors.

Another problem in the design of integrated circuitry, is the limited number of terminals that can be provided on any one integrated circuit chip. Naturally, provision must be made for both input and output terminals to the chip, and also, provision must be made for a power supply terminal and a ground terminal. The provision of these necessary terminals on the integrated circuit chip further limits the number of available terminals. Therefore, it is undesirable, as a remedy for the capacitance problem, to provide discrete component emitter bypass capacitors connected to the integrated circuit chip by means of the remaining terminals on the chip, since these terminals may be needed for other purposes.

It is, therefore, an object of the present invention to provide an amplifier which, without bypass capacitors to shunt emitter bias resistors, does not have a substantial sacrifice in gain.

With this and other objects in view, a circuit embodying the invention may include a first and a second transistor operated from a source of operating potential. A first means interconnects the collector electrode of the first transistor to the source of potential, and a second means inerconnects the collector electrode of the second transistor to the source of potential. The emiter electrodes of the first and the second transistors are connected to a reference potential by an impedance. A third transistor is interconnected to the second transistor by circuit means to form a degenerate feedback loop which provides the operating bias for the first and the second transistors. Included in the degenerate feedback loop are the emitter and base electrodes of the second transistor and the collector and base electrodes of the third transistors.

Input signals to the amplifier circuit are applied at the base electrode of the first transistor, and output signals are derived at the collector electrodes of the first and the second transistor. The output at the collector electrode of the first transistor is an inverted amplified signal, while the output at the collector electrode of the second transistor is an in-phase amplified signal.

A complete understanding of the invention may be obtained from the following detailed description thereof, when taken in conjunction with the accompanying drawings, in which.

Figure 1:
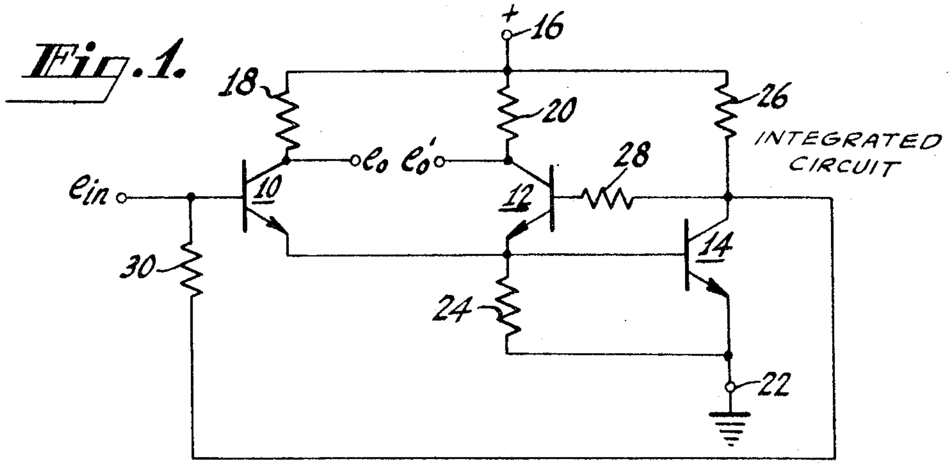
FIGURE 1 is a schematic circuit diagram of a differential stabilized amplifier.

Reference is now made to the drawings wherein like reference numerals designate similar elements in the various figures, and more particularly to FIGURE 1, which illustrates the differential stabilized amplifier. The differential stabilized amplifier includes three transistors 10, 12 and 14. The transistors 12 and 14, with the accompanying interconnections, described in greater detail hereinafter, represent a low impedance, stabilized bias supply. This bias supply is described in a patent application entitled, "Electrical Circuits," filed Nov. 29, 1965, Ser. No. 510,180, now U.S. Patent No. 3,430,155 in the name of Leopold A. Harwood and assigned to the Radio Corporation of America.

The collector electrode of the transistor 10 is connected to a terminal 16 by a resistor 18, and the collector electrode of the transistor 12 is connected to the terminal 16 by a resistor 20. The emitter electrodes of the transistors 10 and 12 are connected in common, their junction being connected to a terminal 22 by a resistor 24. The terminals 16 and 22 are adapted to be energized by a source of potential. As shown in the configuration of FIGURE 1, a positive source of operating potential, not shown, is applied to the terminal 16, while the terminal 22 is connected to a reference potential, shown as ground.

The collector electrode of the transistor 14 is connected to the terminal 16 and, hence, the source of operating potential by a resistor 26; a direct connection interconnects the emitter electrode of the transistor 14 and the reference potential, ground, at the terminal 22. The base electrode of the transistor 14 is directly connected to the emitter electrode of the transistor 12, and a resistor 28 interconnects the base electrode of the transistor 12 and the collector electrode of the transistor 14. An isolating resistor 30 interconnects the base electrode of the transistor 10 and the collector electrode of the transistor 14.

As can be seen, the two transistors 12 and 14 are interconnected to form a degenerate feedback loop which is critical to obtaining the low impedance points and is mentioned hereinafter. The degenerate loop includes the emitter and the base electrodes of the transistor 12, the resistor 28 and the collector and the base electrodes of the transistor 14.

As used hereinbelow the term $V_{be}$ voltage represents the average base-to-emitter voltage of a transistor which is operating as the active device in an amplifier circuit or the like. For silicon transistors, the $V_{be}$ voltage is approximately 0.7 volt, which is within the range of the proper $V_{be}$ voltage for Class A amplification. In addition, it is assumed, for the purposes of the discussion below, that all the transistors are fabricated from the same type of semiconductor material.

When equilibrium is established in the bias supply, a voltage drop of one $V_{be}$ is developed across the base emitter-junction of each of the transistors 12 and 14. From the emitter electrode to the base electrode of the transistor 14, there is a voltage increase of one $V_{be}$, and from the emitter electrode to the base electrode of the transistor 12, there is a voltage increase of one $V_{be}$. Consequently, the voltage developed at the base electrodes of the transistors 14 and 12, with respect to the ground potential at the terminal 22, is one $V_{be}$ and two $V_{be}$, respectively. Moreover, as only a very small current flows in the base electrode lead of the transistor 12, the voltage drop developed across resistor 28 is negligible and a voltage of two $V_{be}$ appears at the collector electrode of the transistor 14.

The junction of the emitter electrode of the transistor 12 and the base electrode of the transistor 14 is a low impedance point. The impedance at this junction point is in the order of one ohm. In addition, the junction of the collector electrode of the transistor 14 and the resistor 28 is also a low impedance point; however, this junction is not quite as low an impedance point as mentioned above. Thus, the junction of the emitter electrode of the transistor 12 and the base electrode of the transistor 14 and the junction of the collector electrode of the transistor 14 and the resistor 28 are low impedance points which provide a stabilized bias voltage of one $V_{be}$ and two $V_{be}$, respectively.

A bias voltage of one $V_{be}$ is applied to the emitter electrodes of both the transistors 10 and 12. A bias of two $V_{be}$, which appears at the collector electrode of the transistor 14, is applied to the base electrode of the transistor 14 by means of the isolating resistor 30. And, as has been previously mentioned, a voltage of two $V_{be}$ has been developed at the base electrode of the transistor 12. It should be noted that the differential amplifier is completely biased by only one power supply connected to energize the terminal 16.

The quiescent current flowing in the collector-emitter electrodes of the transistors 10 and 12 is determined by the choice of the resistor 24. Since the voltage developed between the junction of the emitter electrodes of the transistors 10 and 12 with the base electrode of the transistor 14 and the grounded terminal 22 is one $V_{be}$ ,the size of the resistor 24 will determine the current flow. Naturally, it has been assumed that the current flowing in the base electrode of the transistor 14 is so small in comparison to the current flowing through the resistor 24 that it may be neglected. Moreover, as has been previously indicated, the emitter electrode of the transistor 12 is a low impedance point, and, hence, the emitter electrode of the transistor 10 is connected to a low impedance point. This, in turn, determines that the voltage gain of the transistors 10 and 12, where outputs are taken off the collector electrodes, will be high. That is, there will be no significant loss in gain.

The input to the differential stabilized amplifier $e_{in}$ is applied at the base electrode of the transistor 10. The outputs $e_o$ and $e'_o$ for the amplifier are taken at the collector electrodes of the transistors 10 and 12, respectively. The output $e_o$ is the inverted, amplified signal applied to the base electrode of transistor 10, while the output $e'_o$ is the in-phase amplified signal.

In operation, a signal is applied to the base electrode of the transistor 10 and is amplified, giving an inverted output $e_o$ at the collector electrode of the transistor. The input signal also appears at the emitter of the transistor 10 where it is coupled in the base of the transistor 14.

It should be noted that the junction of the emitter of the transistor 10 and the base of the transistor 14 is a low impedance point. Consequently, only a very small input signal voltage is developed at the base of the transistor 14. The input to the transistor 14 appears amplified and inverted at the collector of the transistor, where it is applied to the base of the transistor 12. The transistor 12 amplifies the input signal voltage applied to its base electrode and gives an inverted output at its collector electrode.

Since the original input signal applied at the base of the transistor 10 has been inverted twice, the output $e'_o$ is an in-phase amplified reproduction of the original signal.

If the resistor 18 and the resistor 20 have equal resistance, the voltage developed at the outputs of the differential stabilized amplifier will be equal in magnitude and opposite in phase. Moreover, because of the stabilized bias supply, the outputs from the differential amplifier are also stabilized. Again, it should be noted, as stated above, that since the junction of the emitters of the transistors 10 and 12 is a low impedance point, there is no substantial loss in the gain in either of the transistors.

Figure 2:
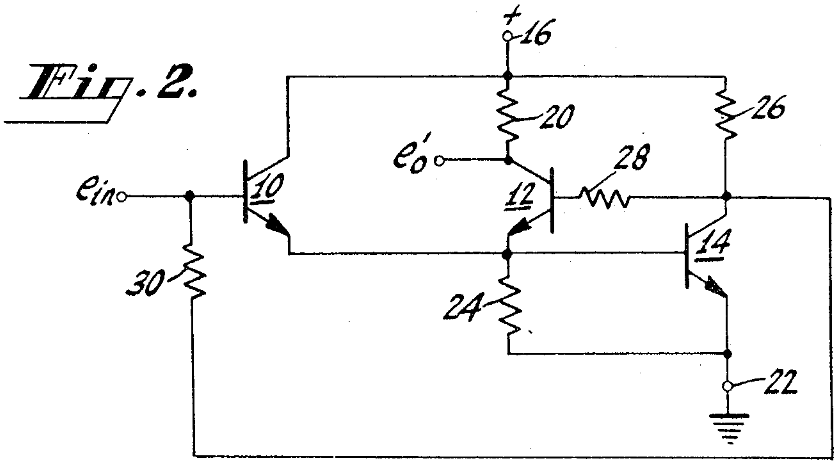
FIGURE 2 is a schematic circuit diagram of a single ended stabilized amplifier.
Figure 3:
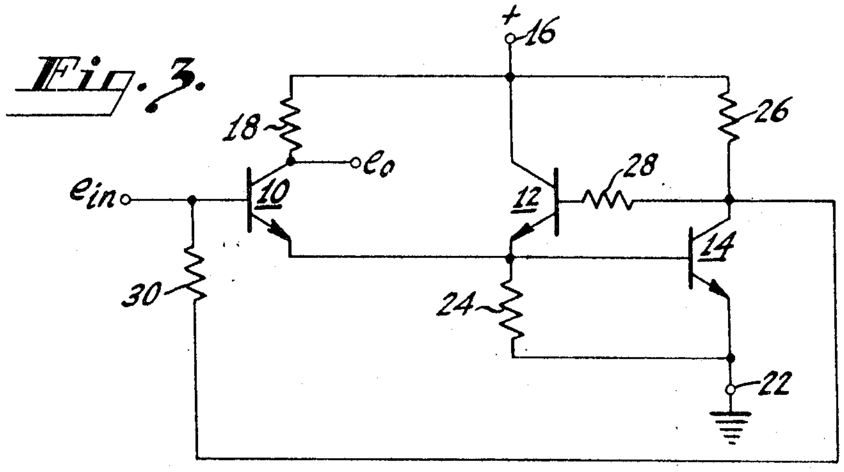
FIGURE 3 is a schematic circuit diagram of another embodiment of the single ended stabilized amplifier shown in FIGURE 2.

Referring now to FIGURES 2 and 3 there is shown a single-ended stabilized amplifier. The amplifier of FIGURE 2 differs from the differential stabilized amplifier shown in FIGURE 1 in that the resistor 18 has been omitted and only one output $e'_o$ is taken at the collector electrode of the transistor 12. Similarly, the amplifier of FIGURE 3 differs from the differential stabilized amplifier shown in FIGURE 1 in that the resistor 20 has been omitted and only one output $e_o$ is taken at the collector electrode of the transistor 10.

The operation of the circuits shown in FIGURES 2 and 3 is similar to that of the differential stabilized amplifier shown in FIGURE 1 and, naturally, has similar advantages. As before, the output signals $e_o$ and $e'_o$ are an amplified reproduction of the input signal $e_{in}$ applied at the base electrode of the transistor 10. Also, the output signal $e_o$ is inverted from the input signal $e_{in}$, while the output signal $e'_o$ is in phase with the input signal $e_{in}$.

The following figures represent the values of components used in the preferred embodiment of the present invention shown in FIGURE 1:

Resistors:

| | | |
|---|---|---|
| **18** | kilohms | 2 |
| **20** | do | 2 |
| **24** | ohms | 700 |
| **26** | kilohms | 10 |
| **28** | do | 2 |
| **30** | do | 2 |

Many modifications may be made to the present invention without departing from the spirit and scope thereof. It is, therefore, to be understood that the above arrangement is simply illustrative of an application of the principles of the invention and many other modifications may be made without departing from the invention.

What is claimed is:

1. An amplifier circuit comprising:
- a first and a second transistor each having a base electrode, an emitter electrode and a collector electrode, operated from a source of operating potential;
- first means for connecting the collector electrode of said first transistor to said source of operating potential;
- a second means for connecting the collector electrode of said second transistor to said source of operating potential;
- a reference potential;
- an impedance interconnecting the emitter electrodes of said first and said second transistors to said reference potential;
- means for applying input signals to the base electrode of said first transistor;
- a third transistor having a base electrode, an emitter electrode and a collector electrode, operated from said source of operating potential;
- circuit means interconnecting said second and said third transistors such that a degenerate feedback loop is formed which provides operating bias for said first and said second transistors, said loop including the emitter and base electrodes of said second transistor and the collector and base electrodes of said third transistor; and means for deriving output signals from at least one of the collector electrodes of said first and said second transistors.

2. An amplifier circuit as in claim 1 wherein said first collector electrode connecting means includes a resistor and said output signal is derived from the collector electrode of said first transistor.

3. An amplifier circuit as in claim 1 wherein said second collector electrode connecting means includes a resistor and said output signal is derived from the collector electrode of said second transistor.

4. An amplifier circuit as in claim 1 wherein said first and second collector electrode connecting means each include a resistor and wherein said last mentioned means derives output signals from the collector electrodes of said first and second transistor.

5. An amplifier circuit as in claim 4 wherein said interconnecting impedance comprises a third resistor.

6. An amplifier circuit as in claim 5 wherein said first, second and third transistors, said resistors, and said interconnecting circuit means are all disposed in an integrated circuit.

7. An amplifier circuit comprising:

a first and a second transistor each having a base electrode, an emitter electrode and a collector electrode, operated from a source of operating potential;

a first resistor connecting the collector electrode for said first transistor to said source of operating potential;

a second resistor connecting the collector electrode of said second transistor to said source of operating potential;

a reference potential;

a third resistor connecting the emitter electrodes of said first and said second transistors to said reference potential;

means for applying input signals to the base electrode of said first transistor;

a third transistor having a base electrode, an emitter electrode and a collector electrode, operated from said source of operating potential;

a fourth resistor connecting the collector electrode of said third transistor to said source of operating potential;

a fifth resistor connecting the collector electrode of said third transistor to the base electrode of said second transistor;

means for directly connecting the base electrode of said third transistor to the emitter electrode of said second transistor;

means for directly connecting the emitter electrode of said third transistor to said reference potential;

a sixth resistor connecting the collector electrode of said third transistor to the base electrode of said first transistor; and means for deriving output signals from at least one of the collector electrodes of said first and said second transistor.

References Cited

UNITED STATES PATENTS 3,364,434 1/1968 Widlar ---------- 350—30 X

ROY LAKE, Primary Examiner

JAMES B. MULLINS, Assistant Examiner

U.S. Cl. X.R.

330—22, 30

PO-1050
(5/69)

UNITED STATES PATENT OFFICE
CERTIFICATE OF CORRECTION

Patent No. 3,460,049 Dated August 5, 1969

Inventor(s) Erwin J. Wittmann

It is certified that error appears in the above-identified patent and that said Letters Patent are hereby corrected as shown below:

Column 3, lines 30-31, cancel "transistor 14" and substitute therefor -- transistor 10 --.

SIGNED AND
SEALED
MAR 17 1970

(SEAL)
Attest:

Edward M. Fletcher, Jr.
Attesting Officer

WILLIAM E. SCHUYLER, JR.
Commissioner of Patents